United States Patent
Little et al.

(10) Patent No.: US 8,252,117 B2
(45) Date of Patent: Aug. 28, 2012

(54) AUTOMATIC FEED SYSTEM AND RELATED PROCESS FOR INTRODUCING SOURCE MATERIAL TO A THIN FILM VAPOR DEPOSITION SYSTEM

(75) Inventors: Edwin Jackson Little, Denver, CO (US); Max William Reed, Niwot, CO (US); Christopher Rathweg, Louisville, CO (US); Mark Jeffrey Pavol, Arvada, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 367 days.

(21) Appl. No.: 12/683,831

(22) Filed: Jan. 7, 2010

(65) Prior Publication Data
US 2011/0165326 A1 Jul. 7, 2011

(51) Int. Cl.
*C23C 16/00* (2006.01)
*G01F 11/00* (2006.01)
*B65G 53/40* (2006.01)
*B65B 1/04* (2006.01)
*B65B 3/04* (2006.01)
*B67C 3/00* (2006.01)

(52) U.S. Cl. ........ 118/726; 118/727; 118/303; 118/308; 118/309; 118/310; 118/311; 118/312; 222/220; 222/217; 222/272; 222/271; 406/128; 406/129; 141/320

(58) Field of Classification Search ............... 118/726, 118/727, 303, 308–312; 222/220, 217, 272, 222/271; 406/128, 129; 141/320
See application file for complete search history.

(56) References Cited

U.S. PATENT DOCUMENTS

| | | | |
|---|---|---|---|
| 3,710,808 A * | 1/1973 | Celada et al. | 137/1 |
| 3,845,737 A * | 11/1974 | Heussy et al. | 118/694 |
| 5,248,349 A | 9/1993 | Foote et al. | |
| 5,304,499 A | 4/1994 | Bonnet et al. | |
| 5,366,764 A | 11/1994 | Sunthankar | |
| 5,372,646 A | 12/1994 | Foote et al. | |
| 5,712,187 A | 1/1998 | Li et al. | |
| 5,994,642 A | 11/1999 | Higuchi et al. | |
| 6,058,740 A | 5/2000 | McMaster et al. | |

(Continued)

FOREIGN PATENT DOCUMENTS

EP 0853345 A1 7/1998

OTHER PUBLICATIONS www.shake-it.com/e-z-weigh-sys.html; Jan. 7, 2010 Weigh-Systems Feeder/Hooper is a prior art system.

*Primary Examiner* — Keath Chen
(74) *Attorney, Agent, or Firm* — Dority & Manning, P.A.

(57) ABSTRACT

A feed system and related process are configured to continuously feed measured doses of source material to a vapor deposition apparatus wherein the source material is sublimated and deposited as a thin film on a substrate. The system includes a bulk material hopper, and an upper dose cup disposed to receive source material from the hopper. A lower dose cup is disposed in a vacuum lock chamber to receive a measured dose of source material from the upper dose cup. A transfer mechanism is disposed below the vacuum lock chamber to receive the measured dose of source material from the lower dose cup and to transfer the source material to a downstream deposition head while isolating the deposition conditions and sublimated source material within the deposition head.

11 Claims, 5 Drawing Sheets

U.S. PATENT DOCUMENTS

| | | |
|---|---|---|
| 6,423,565 B1 | 7/2002 | Barth et al. |
| 6,444,043 B1 | 9/2002 | Gegenwart et al. |
| 6,719,848 B2 | 4/2004 | Faykosh et al. |
| 7,194,197 B1 | 3/2007 | Wendt et al. |
| 2002/0117199 A1 | 8/2002 | Oswald |
| 2003/0044539 A1 | 3/2003 | Oswald |
| 2005/0002742 A1* | 1/2005 | Bachmann ................ 406/10 |
| 2007/0007109 A1* | 1/2007 | Powell et al. ............. 198/757 |
| 2008/0205999 A1* | 8/2008 | Rieger et al. .............. 406/96 |
| 2009/0061090 A1* | 3/2009 | Negishi ................ 427/255.28 |
| 2009/0194165 A1 | 8/2009 | Murphy et al. |
| 2010/0213281 A1* | 8/2010 | Mauchle et al. ........... 239/373 |

* cited by examiner

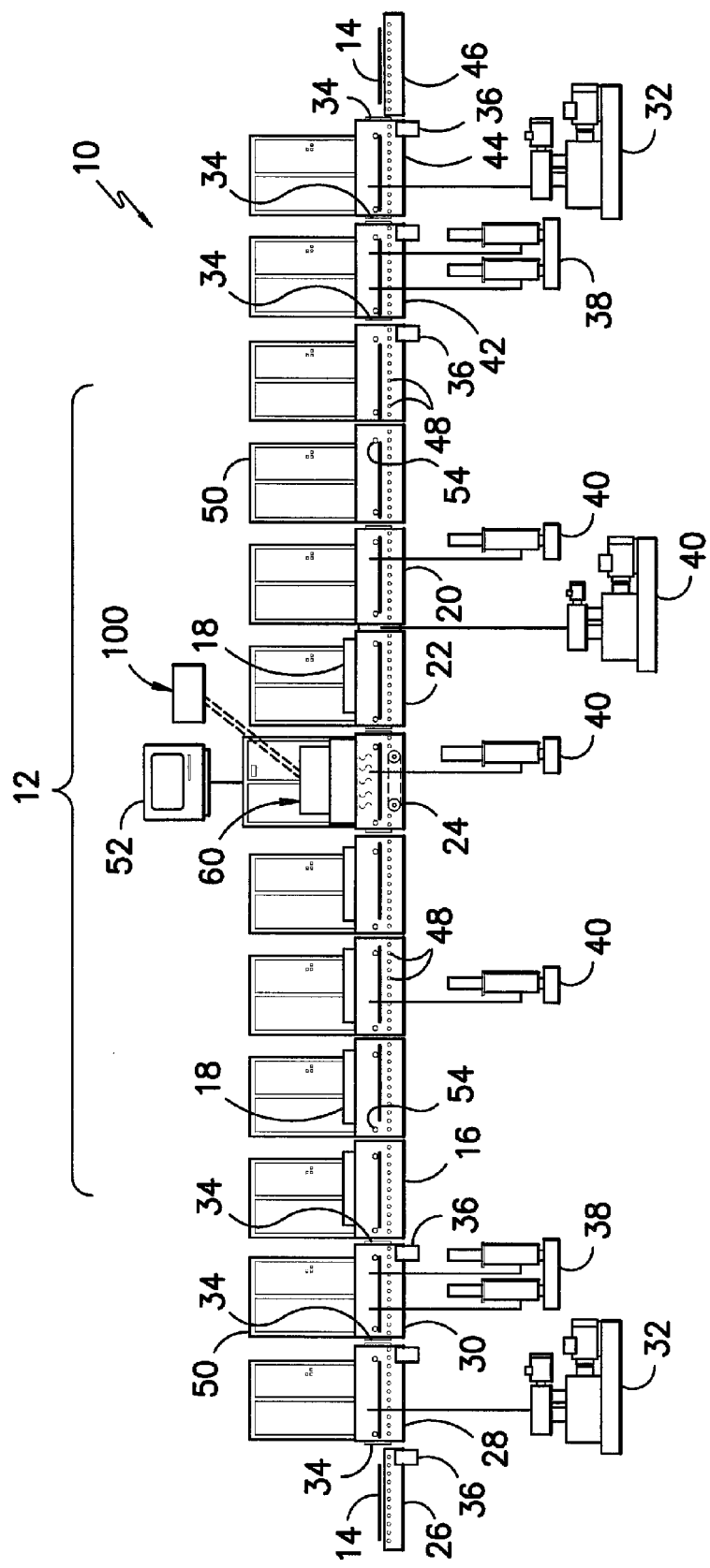
FIG. -1-

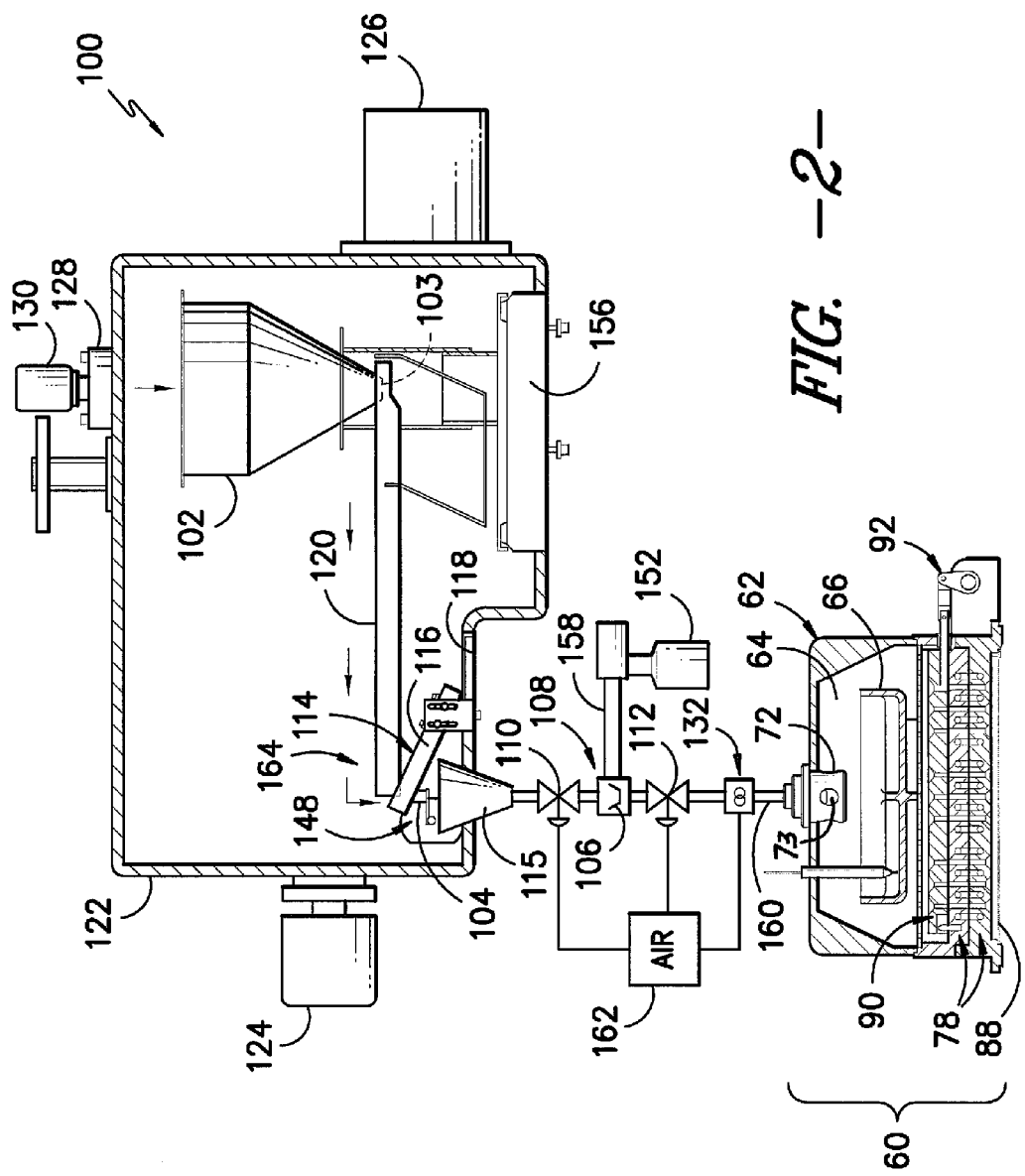
FIG. -2-

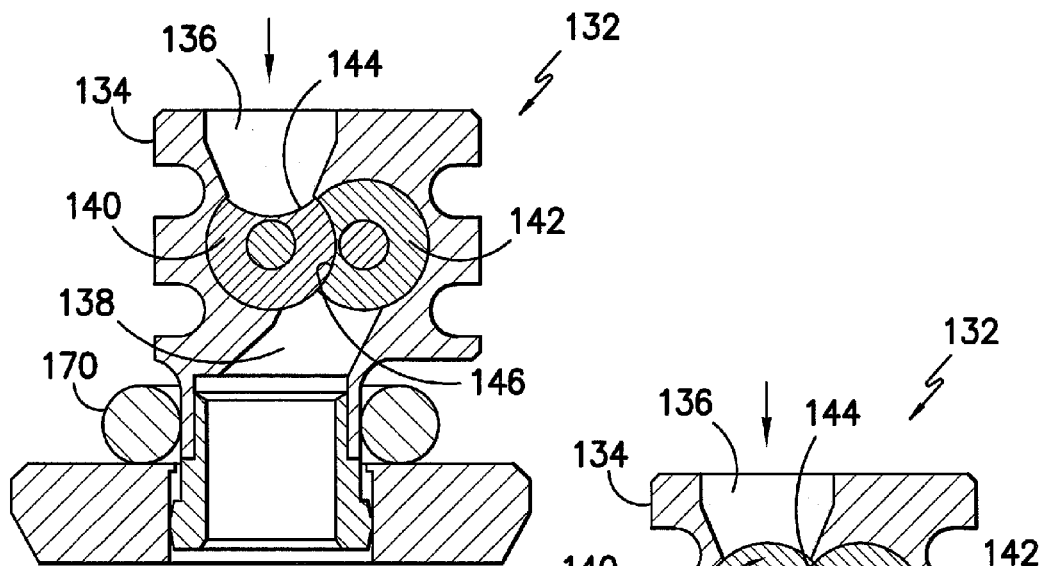
FIG. -3-
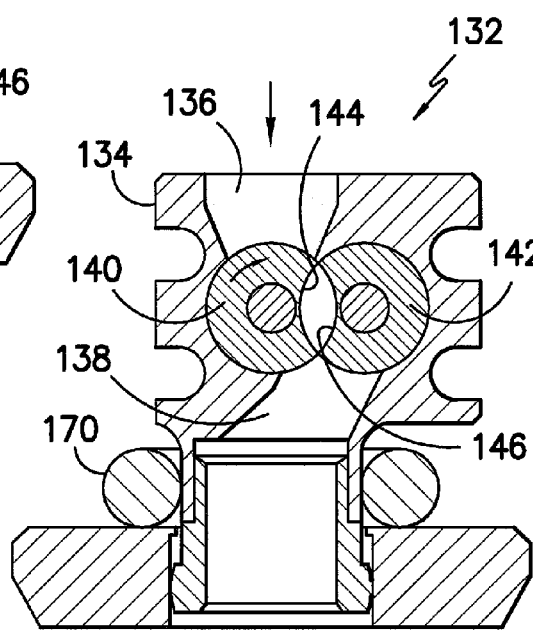
FIG. -4-
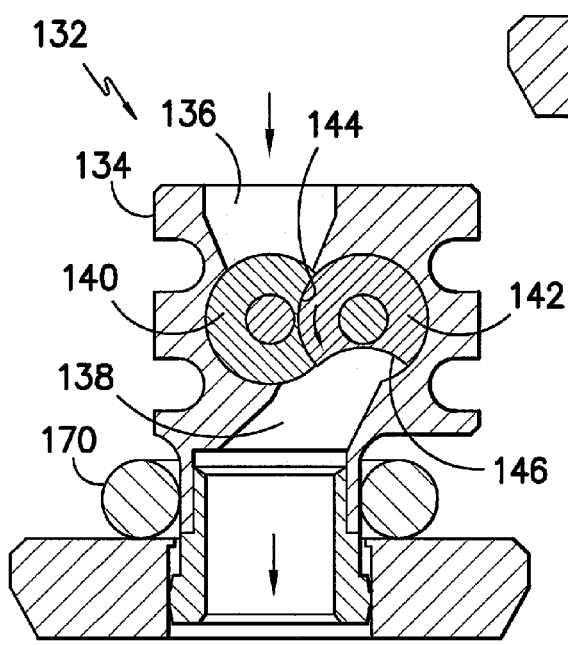
FIG. -5-

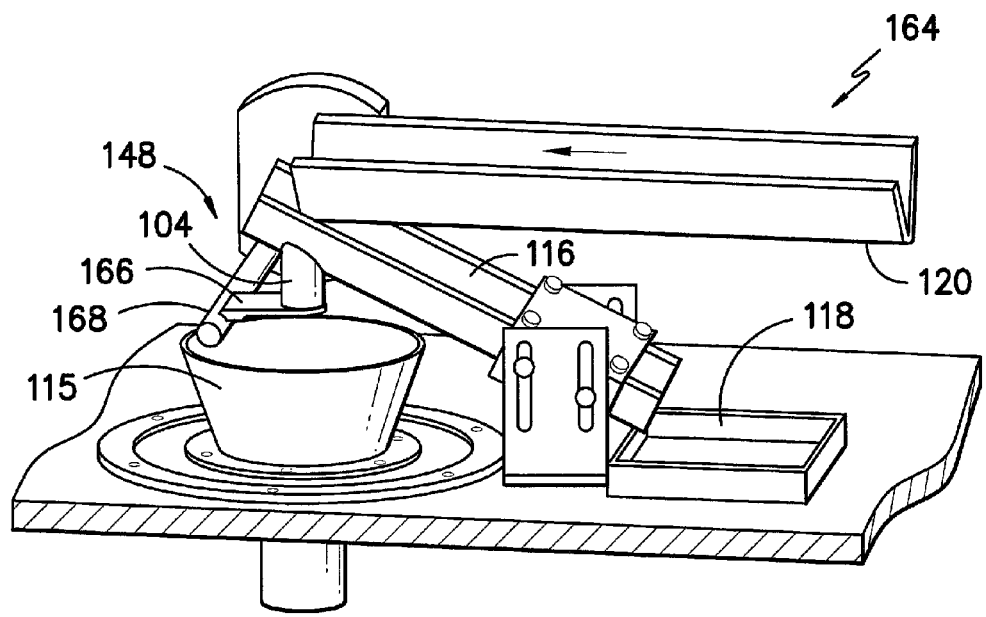
FIG. -6-
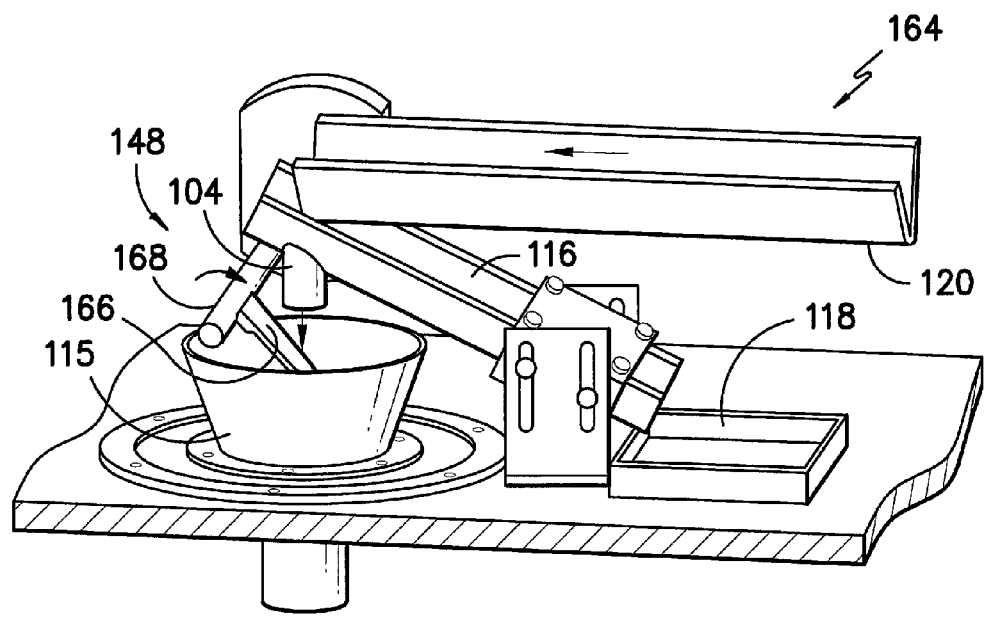
FIG. -7-

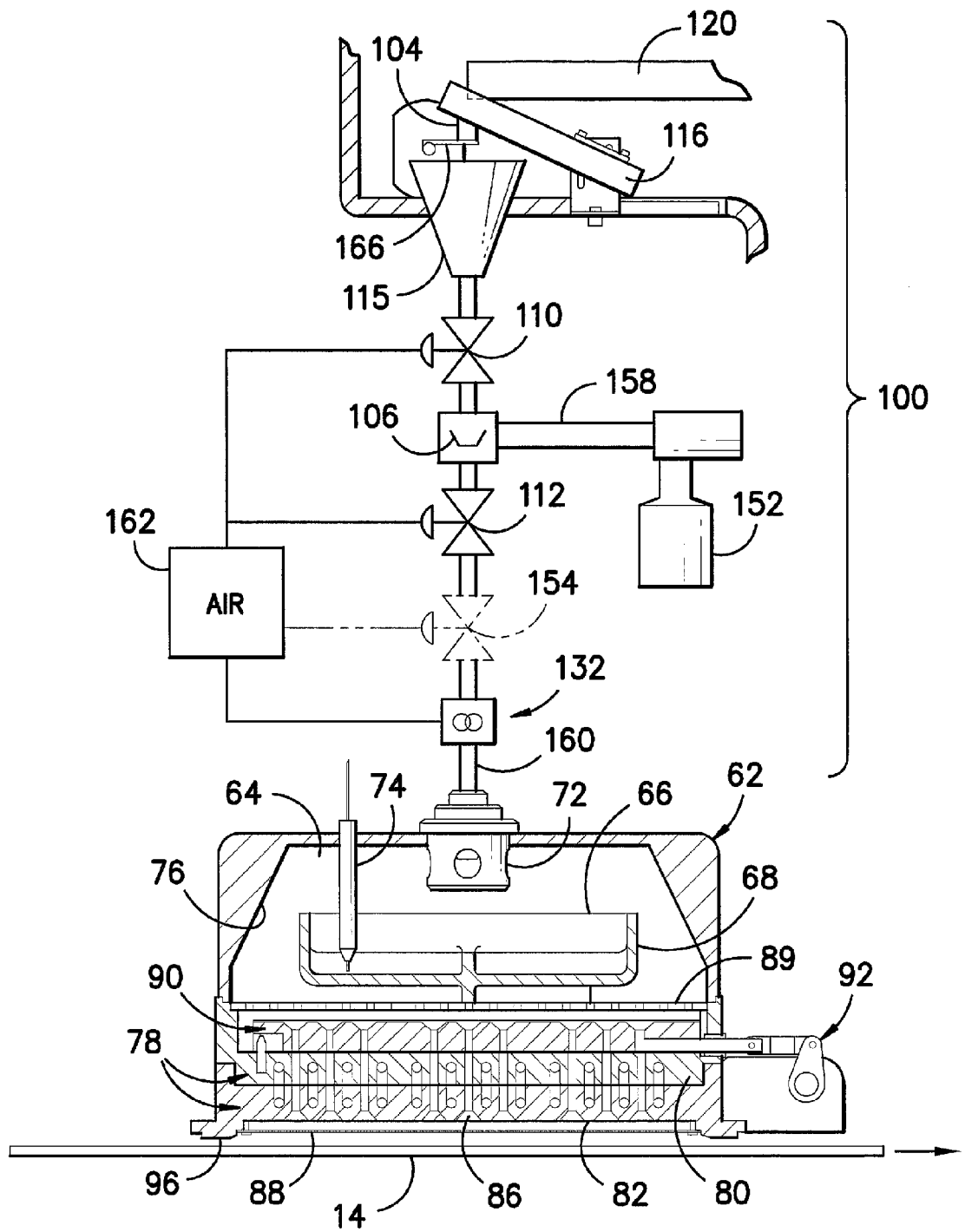
FIG. -8-

AUTOMATIC FEED SYSTEM AND RELATED PROCESS FOR INTRODUCING SOURCE MATERIAL TO A THIN FILM VAPOR DEPOSITION SYSTEM

FIELD OF THE INVENTION

The present invention relates generally to the field of thin film deposition systems wherein a thin film layer, such as a semiconductor layer, is deposited on a substrate conveyed through the system. More particularly, the invention is related to a feed system configured to automatically introduce source material into a vapor deposition apparatus without disruption of the vacuum process.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of sunlight (solar energy) to electricity. For example, CdTe has an energy bandgap of 1.45 eV, which enables it to convert more energy from the solar spectrum as compared to lower bandgap (1.1 eV) semiconductor materials historically used in solar cell applications. Also, CdTe converts energy in lower or diffuse light conditions as compared to the lower bandgap materials and, thus, has a longer effective conversion time over the course of a day or in cloudy conditions as compared to other conventional materials. Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner.

Certain factors greatly affect the efficiency of CdTe PV modules in terms of cost and power generation capacity of the modules. For example, CdTe is relatively expensive and, thus, efficient utilization (i.e., minimal waste) of the material is a primary cost factor. In addition, the ability to process relatively large substrates on an economically sensible commercial scale is a crucial consideration.

CSS (Close Space Sublimation) is a known commercial vapor deposition process for production of CdTe modules. Reference is made, for example, to U.S. Pat. No. 6,444,043 and U.S. Pat. No. 6,423,565. Within the vapor deposition chamber in a CSS process, the substrate is brought to an opposed position at a relatively small distance (i.e., about 2-3 mm) opposite to a CdTe source. The CdTe material sublimes and deposits onto the surface of the substrate. In the CSS system of U.S. Pat. No. 6,444,043 cited above, the CdTe material is in granular form and is held in a heated receptacle within the vapor deposition chamber. The sublimed material moves through holes in a cover placed over the receptacle and deposits onto the stationary glass surface, which is held at the smallest possible distance (1-2 mm) above the cover frame. The cover is heated to a temperature greater than the receptacle.

While there are advantages to known CSS processes, the systems are inherently a batch process wherein the glass substrate is indexed into a vapor deposition chamber, held in the chamber for a finite period of time in which the film layer is formed, and subsequently indexed out of the chamber. The system is more suited for batch processing of relatively small surface area substrates. The process must be periodically interrupted in order to replenish the CdTe source, which is detrimental to a large-scale production process.

Accordingly, there exists an ongoing need in the industry for an improved vapor deposition apparatus for economically feasible large-scale production of efficient PV modules, particularly CdTe modules. The present invention relates to a feed system that serves this purpose.

BRIEF DESCRIPTION OF THE INVENTION

Aspects and advantages of the invention will be set forth in part in the following description, or may be obvious from the description, or may be learned through practice of the invention.

In accordance with aspects of the invention, an embodiment of a feed system is provided for continuously feeding measured doses of source material to a deposition head in a vapor deposition apparatus wherein the source material is sublimated and deposited as a thin film on a substrate, such as a photovoltaic (PV) module substrate. A "thin" film is generally recognized in the art as less than 10 microns (μm) in thickness. The feed system includes a refillable bulk material hopper, and an upper dose cup disposed to receive source material from the hopper. A lower dose cup is disposed in a vacuum lock chamber and receives a measured dose of source material from the upper dose cup. A transfer mechanism is disposed below the vacuum lock chamber to receive the measured dose of source material from the lower dose cup. The transfer mechanism is configured to transfer the source material to a downstream deposition head for subsequent sublimation and deposition on the substrates while isolating the higher process temperatures within the deposition head and blocking the movement (diffusion) of sublimated gases from traveling upstream within the feed system.

Variations and modifications to the embodiment of the feed system discussed above are within the scope and spirit of the invention and may be further described herein.

The present invention also encompasses various embodiments of a vapor deposition apparatus for vacuum deposition of a sublimated source material as a thin film on a substrate conveyed through the apparatus. A particular embodiment of the vapor deposition apparatus includes a deposition head in which source material supplied thereto is sublimated under conditions of high temperature and vacuum. A conveyor assembly is operably disposed below the deposition head to convey a substrate through the apparatus while a thin film of the sublimated source material is deposited onto an upper surface of the substrate. A feed system is configured with the deposition head to continuously feed measured doses of source material thereto. This feed system may include a refillable bulk material hopper, and an upper dose cup disposed to receive source material from the hopper. A lower dose cup is disposed in a vacuum lock chamber and receives a measured dose of source material from the upper dose cup. A transfer mechanism is disposed below the vacuum lock chamber to receive the measured dose of source material from the lower dose cup. The transfer mechanism is configured to transfer the source material to a downstream deposition chamber for subsequent sublimation and deposition on the substrates while isolating the higher process temperatures within the deposition head and blocking the movement (diffusion) of sublimated gases from traveling upstream within the feed system.

Variations and modifications to the embodiment of the vapor deposition apparatus discussed above are within the scope and spirit of the invention and may be further described herein.

The present invention also encompasses various embodiments of a process for continuously supplying source material to a vapor deposition apparatus without interrupting a vacuum deposition process in the apparatus wherein the source material is sublimated and deposited as a thin film on a substrate conveyed through the vapor deposition apparatus. In a particular embodiment, the process includes generating a measured amount of the source material, for example from a refillable supply hopper. The source material is then moved through a vacuum equalizing process, which may include moving the measured amount of source material into a vacuum lock chamber, wherein the vacuum pressure is equalized with the vacuum in a downstream deposition head. The source material is then transferred into the deposition head while maintaining vacuum and without interrupting the sublimation process within the deposition head.

Variations and modifications to the embodiment of the process discussed above are within the scope and spirit of the invention and may be further described herein.

These and other features, aspects and advantages of the present invention will become better understood with reference to the following description and appended claims.

BRIEF DESCRIPTION OF THE DRAWING

A full and enabling disclosure of the present invention, including the best mode thereof, is set forth in the specification, which makes reference to the appended drawings, in which:

FIG. 1 is a plan view of a system that may incorporate embodiments of a vapor deposition apparatus incorporating a source material feed system in accordance with aspects of the present invention;

FIG. 2 is a partial cross-sectional view of a particular embodiment of a source material feed system;

FIGS. 3 through 5 are cross-sectional sequential operation views of an embodiment of a transfer mechanism;

FIG. 6 is a perspective view of an embodiment of a transport mechanism in a first operational configuration;

FIG. 7 is a perspective view of the transport mechanism of FIG. 6 in a second operational configuration; and, FIG. 8 is a partial cross-sectional view of an alternate embodiment of source material system in accordance with aspects of the invention.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIG. 1 illustrates an embodiment of a vapor deposition system 10 that may incorporate a source material feed system 100 in accordance with aspects of the invention, particularly as a component of a vapor deposition apparatus or module 60. The system 10 is configured for deposition of a thin film layer on a photovoltaic (PV) module substrate 14 (referred to hereafter as "substrate"). The thin film may be, for example, a film layer of cadmium telluride (CdTe). As mentioned, it is generally recognized in the art that a "thin" film layer on a PV module substrate is generally less than about 10 microns (μm). It should be appreciated that the present feed system 100 is not limited to use in the system 10 illustrated in FIG. 1, but may be incorporated into any suitable processing line configured for vapor deposition of a thin film layer onto a PV module substrate 14 or other substrate.

For reference and an understanding of an environment in which the present source material feed system 100 may be used, the system 10 of FIG. 1 is described below, followed by a detailed description of the feed system 100.

Referring to FIG. 1, the exemplary system 10 includes a vacuum chamber 12 defined by a plurality of interconnected modules. A plurality of interconnected heater modules 16 define a pre-heat section of the vacuum chamber 12 through which the substrates 14 are conveyed and heated to a desired temperature before being conveyed into the vapor deposition apparatus 60. Each of the modules 16 may include a plurality of independently controlled heaters 18, with the heaters defining a plurality of different heat zones. A particular heat zone may include more than one heater 18.

The vacuum chamber 12 also includes a plurality of interconnected cool-down modules 20 within the vacuum chamber 12 downstream of the vapor deposition apparatus 60. The cool-down modules 20 define a cool-down section within the vacuum chamber 12 in which the substrates 14 having the thin film of sublimed source material deposited thereon are allowed to cool at a controlled cool-down rate prior to the substrates 14 being removed from the system 10. Each of the modules 20 may include a forced cooling system wherein a cooling medium, such as chilled water, refrigerant, or other medium is pumped through cooling coils configured with the modules 20.

In the illustrated embodiment of system 10, at least one post-heat module 22 is located immediately downstream of the vapor deposition apparatus 60 and before the cool-down modules 20. As the leading section of a substrate 14 is conveyed out of the vapor deposition apparatus 60, it moves into the post-heat module 22, which maintains the temperature of the substrate 14 at essentially the same temperature as the remaining portion of the substrate 14 within the vapor deposition apparatus 60. In this way, the leading section of the substrate 14 is not allowed to cool while the trailing section of the substrate 14 is still within the vapor deposition apparatus 60. If the leading section of a substrate 14 were allowed to cool as it exited the apparatus 60, a non-uniform temperature would be generated longitudinally along the substrate 14. This condition could result in the substrate breaking from thermal stress.

As diagrammatically illustrated in FIG. 1, the feed system 100 is configured with the vapor deposition apparatus 60 to supply source material, such as granular CdTe. The feed system 100 supplies the source material without interrupting the continuous vapor deposition process within the apparatus 60 or conveyance of the substrates 14 through the apparatus 60.

Still referring to FIG. 1, the individual substrates 14 are initially placed onto a load conveyor 26, and are subsequently moved into an entry vacuum lock station that includes a load module 28 and a buffer module 30. A "rough" (i.e., initial) vacuum pump 32 is configured with the load module 28 to draw an initial vacuum, and a "fine" (i.e., final) vacuum pump 38 is configured with the buffer module 30 to increase the vacuum in the buffer module 30 to essentially the vacuum within the vacuum chamber 12. Valves 34 (e.g., gate-type slit valves or rotary-type flapper valves) are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 at atmospheric pressure into the vacuum chamber 12 in a step-wise manner without affecting the vacuum within the chamber 12.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and valves 34 are sequentially operated to move the substrates 14 out of the vacuum chamber 12 to atmospheric pressure outside of the system 10 in a step-wise fashion without loss of vacuum condition within the vacuum chamber 12.

System 10 also includes a conveyor system configured to move the substrates 14 into, through, and out of the vacuum chamber 12. In the illustrated embodiment, this conveyor system includes a plurality of individually controlled conveyors 48, with each of the various modules including one of the conveyors 48. It should be appreciated that the type or configuration of the conveyors 48 in the various modules may vary. In the illustrated embodiment, the conveyors 48 are roller conveyors having driven rollers that are controlled so as to achieve a desired conveyance rate of the substrates 14 through the respective modules and the system 10 overall.

The vapor deposition apparatus 60 may include a dedicated conveyor system 24 that is specifically designed to convey the substrates through the apparatus 60 for efficient deposition of the sublimated source material onto a surface of the substrates 14.

As described, each of the various modules and respective conveyors in the system 10 are independently controlled to perform a particular function. For such control, each of the individual modules may have an associated independent controller 50 configured therewith to control the individual functions of the respective modules. The plurality of controllers 50 may, in turn, be in communication with a central system controller 52, as illustrated in FIG. 1. The central system controller 52 can monitor and control (via the independent controllers 50) the functions of any one of the modules so as to achieve an overall desired heat-up rate, deposition rate, cool-down rate, substrate conveyance speed, and so forth, in processing of the substrates 14 through the system 10.

Referring to FIG. 1, for independent control of the individual respective conveyors 48, each of the modules may include any manner of active or passive sensor 54 that detects the presence of the substrates 14 as they are conveyed through the module. The sensors 54 are in communication with the respective module controller 50, which is in turn in communication with the central controller 52. In this manner, the individual respective conveyors 48 may be controlled to ensure that a proper spacing between the substrates 14 is maintained and that the substrates 14 are conveyed at the desired constant conveyance rate into, through, and out of the vacuum chamber 12.

The vapor deposition apparatus 60 may take on various configurations and operating principles within the scope and spirit of the invention, and is generally configured for vapor deposition of a sublimated source material, such as CdTe, as a thin film on the PV module substrates 14. In the embodiment of the system 10 illustrated in FIG. 1, the apparatus 60 is a module that includes a casing in which the internal components are contained, including a vacuum deposition head 62 (FIG. 2) mounted above the conveyor assembly 24.

Referring to FIGS. 2 and 8, the deposition head 62 is depicted in greater detail. The deposition head 62 defines an interior vacuum deposition chamber 64 in which a receptacle 66 is configured for receipt of a granular source material (not shown) from the feed system 100 via a feed tube connected to a distributor 72 disposed in an opening in a top wall of the deposition head 62. The distributor 72 includes a plurality of discharge ports 73 that are configured to evenly distribute the granular source material into the receptacle 66.

In the illustrated embodiment, at least one thermocouple 74 is operationally disposed through the top wall of the deposition head 62 to monitor temperature within the head chamber adjacent or in the receptacle 66.

The receptacle 66 has a shape and configuration such that end walls 68 of the receptacle 66 are spaced from end walls 76 of the deposition head 62. The side walls of the receptacle 66 lie adjacent to and in close proximity to the side walls of the deposition head 62 (not visible in the view of FIG. 2) so that very little clearance exists between the respective side walls. With this configuration, in operation of the system, sublimated source material will flow out and downwardly over the end walls 68 of the receptacle 66 as leading and trailing curtains of vapor (not depicted in FIG. 2). Very little of the sublimated source material will flow over the side walls of the receptacle 66. It will be appreciated that, in this manner, the sublimated source material will be evenly distributed across the width of the substrate 14 and thereby produce a uniform coating A heated distribution manifold 78 is disposed below the receptacle 66, and may have a clamshell configuration that includes an upper shell member 80 and a lower shell member 82. The mated shell members 80, 82 define cavities in which heater elements are disposed. Encapsulation of the heater elements in this way prevents any potential reaction from occurring between the sublimated gases and the heater elements. The heater elements heat the distribution manifold 78 to a degree sufficient for indirectly heating the source material within the receptacle 66 to cause sublimation of the source material. The heat generated by the distribution manifold 78 also aids in preventing the sublimated source material from plating out onto components of the deposition head 62. Additional heater elements may also be disposed external to the deposition head 62 for this purpose. Desirably, the coolest component within the deposition head 62 is the upper surface of the substrates 14 conveyed there through so that the sublimated source material is ensured to plate primarily on the substrates.

Referring to FIGS. 2 and 8, the heated distribution manifold 78 includes a plurality of passages 86 defined there through. These passages have a shape and configuration so as to uniformly distribute the sublimated source material towards the underlying substrates 14.

A distribution plate 88 is disposed below the manifold 78 at a defined distance above a horizontal plane of the upper surface of an underlying substrate 14. The distribution plate 88 includes a pattern of holes or passages therethrough that further distribute the sublimated source material passing through the distribution manifold 78 in a manner to ensure further uniformity in distribution of the sublimated source material.

As previously mentioned, a significant portion of the sublimated source material will flow out of the receptacle 66 as leading and trailing curtains of vapor. Although these curtains of vapor will diffuse to some extent in the longitudinal direction prior to passing through the distribution plate 88, it should be appreciated that it is unlikely that a uniform distribution of the sublimated source material in the longitudinal direction will be achieved. In other words, more of the sublimated source material will be distributed through the longitudinal end sections of the distribution plate 88 as compared to the middle portion of the distribution plate. However, as discussed above, because the system 10 conveys the substrates 14 through the vapor deposition apparatus 60 at a non-stop constant linear speed, the upper surfaces of the substrates 14 will be exposed to the same deposition environment regardless of any non-uniformity of the vapor distribution along the longitudinal aspect of the apparatus 60. The passages in the distribution manifold 78 and the holes in the distribution plate 88 ensure a uniform distribution of the sublimated source material in the transverse aspect of the vapor deposition apparatus 60. So long as the uniform transverse aspect of the vapor is maintained, a uniform thin film layer is deposited onto the upper surface of the substrates 14.

As illustrated in FIG. 8, it may be desired to include a debris shield 89 between the receptacle 66 and the distribution manifold 78. This shield 89 includes relatively large holes defined there through (as compared to the distribution plate 88 and serves to retain any pieces of indirectly formed solid source material that may have dislodged from surfaces within the deposition head 62, from passing through and potentially interfering with operation of the other components of the deposition head 62. In another embodiment, it may be desirable to make the holes very small, or use a fine mesh screen, so as to prevent even very small granules or particles of solid source material from passing.

The embodiment of FIG. 2 includes a movable shutter plate 90 disposed above the distribution manifold 78. This shutter plate 90 includes a plurality of passages defined there through that align with the passages in the distribution manifold 78 in a first operational position of the shutter plate 90 such that the sublimated source material is free to flow through the shutter plate 90 and through the distribution manifold 78 for subsequent distribution through the plate 88. The shutter plate 90 is movable to a second operational position wherein the passages are misaligned with the passages in the distribution manifold 78. In this configuration, the sublimated source material is blocked from passing through the distribution manifold 78, and is essentially contained within the interior volume of the deposition head chamber 62.

Any suitable actuation mechanism 92 may be configured for moving the shutter plate 90 between the first and second operational positions. In the illustrated embodiment, the actuation mechanism 92 includes a rod and any manner of suitable linkage that connects the rod to the shutter plate 90. The rod is externally rotated by any manner of mechanism located externally of the deposition head 62. The shutter plate 90 is particularly beneficial in that, for any number of reasons, the sublimated source material can be quickly and easily contained within the deposition head 62 and prevented from passing through to the deposition area above the substrates 14. This is desired, for example, during start up of the system 10 while the concentration of vapors within the head chamber builds to a sufficient degree to start the deposition process. Likewise, during shutdown of the system, it is desired to maintain the sublimated source material within the deposition head 62 to prevent the material from plating out on the conveyor or other components of the apparatus 60.

FIG. 1 illustrates an embodiment of the feed system 100 configured for continuously feeding measured doses of source material to the deposition head 62. To obtain consistent thickness and quality of the thin film layer deposited onto the substrates 14, it is desired to continuously feed and maintain a set level of material within the deposition head 62. The feed system 100 includes a bulk material hopper 102 that has a size and shape for receipt of the source material in solid form, such as granular, pellet, or powder form. As discussed above, the source material may be CdTe, which is eventually sublimated in the chamber 64 of the deposition head 62 and deposited as a thin film layer on an underlying substrate 14 (FIG. 1). In the illustrated embodiment, the hopper 102 has a generally truncated or funnel shape with an enlarged inlet that receives the source material from an external supply 130, such as a canister or drum, which mates to a fill port 128. The hopper 102 tapers to an outlet 103.

The source material from the hopper 102 is deposited into a transport mechanism 164 that conveys the source material to an upper dose cup 104. In the illustrated embodiment, the transport mechanism 164 includes a vibration chute 120 that vibrates at a predetermined frequency in order to reliably and consistently move the granular source material along the length of the chute 120. In a typical operation, the vibration would be activated for specified time intervals, with pauses between the intervals. The time intervals would be set as needed to match the fill capacity of a downstream dose cup 104, as described below.

Referring to FIGS. 6 and 7 in particular, the vibration chute 120 conveys the source material to a location above the upper dose cup 104. The dose cup 104 may, for example, be defined as an open-ended cylinder in the upper portion of an overflow chute 116. The cup 104 has an internal volume such that, when the cup 104 is full, a precisely measured dose of the source material is contained within the cup 104. The dose cup 104 may be configured to be adjustable in volume in the event that different overall dose rates are needed. The overflow chute 116 is desirable as an extra protection against overdosing and causing malfunctions of downstream components of the feed system 100.

A release mechanism 148 is configured with the upper dose cup 104 to release the source material from the cup 104 once the cup has been adequately filled with the source material. The release mechanism 148 may take on various configurations. In the illustrated embodiment, the release mechanism 148 includes a hinge plate or trap door 166 that is mounted onto a rotatable rod 168. The plate 166 is biased against the open-end (bottom) of the upper dose cup 104 and, once the cup 104 is filled with the source material, the rod 168 rotates to the position illustrated in FIG. 7 to release the source material from the cup 104 and into a funnel 115 or other suitably shaped receiver. The rod 168 may be driven by a motor or other actuating mechanism at the appropriate time and interval to ensure that the measured doses of source material are continuously and cyclically conveyed (dropped) into the funnel 115 in a manner to synchronize with the point in the feed sequence when the upper vacuum lock valve 110 is open and the lower dose cup 106 is ready to receive material.

The overflow chute 116 is disposed at an incline so that any of the source material that overflows from the top of the upper dose cup 104 slides down the chute 116 and into a catch tray 118. The tray 118 may be periodically removed in order to collect and recycle the overflow CdTe material.

Referring again to FIG. 2, an enclosure 122 defines a controlled space around the hopper 102 and various other components of the feed system 100. The enclosure 122 is formed by any suitable structure that defines an essentially sealed environment around the components. Suction is maintained in the internal volume of the enclosure 122 via a vent suction 126 that draws air into the enclosure 122 through an inlet filter 124. This ventilation air flow through the enclosure 122 ensures that any source material dust or other particulates are captured and filtered by an external ventilation system so as not to present an environmental or health concern in the work environment.

Referring still to FIG. 2, it may be desired to include a weigh scale 156 configured with the hopper 102 for various control functions. For example, the weigh scale 156 may be used to control the amount of source material supplied into the hopper 102 from the external source 130, particularly since the hopper 102 is not visible from outside of the enclosure 122. The weigh scale 156 may also be used to calculate average dose weight and keep track of the ongoing source material consumption within the deposition system.

A lower dose cup 106 is disposed downstream of the upper dose cup 104 in a vacuum lock chamber 108. The lower dose cup 106 receives the measured dose of source material from the upper dose cup 104, and eventually transfers the measured dose of material downstream in a manner so as not to interrupt the vacuum or deposition process within the deposition head 62. The upper dose cup 104 is designed to be smaller than the lower dose cup 106 to ensure that the lower dose cup 106 is not overfilled, which could cause failure of the downstream vacuum lock valves due to contamination of the valves by source material particles. In the embodiment illustrated in FIG. 2, the vacuum lock chamber 108 is defined between an upstream vacuum lock valve 110 and a downstream vacuum lock valve 112. These vacuum lock valves 110, 112 may be conventional gate-style vacuum valves actuated by, for example, an external air supply 162, motor drive, or other suitable actuating member.

In operation, the upper vacuum lock valve 110 is initially open and the lower vacuum lock valve 112 is closed. The measured dose of source material from the upper dose cup 104 travels through the funnel receiver 115, through the upper vacuum lock valve 110, and into the lower dose cup 106. At this point, the upper vacuum lock valve 110 closes and a vacuum is drawn in the chamber or space between the valves 110, 112 by any suitable combination of vacuum pump or pumps 152 that draw through a vacuum port 158 configured with the chamber 108. For example, the vacuum pump configuration 152 may include an initial or "rough" pump that draws an initial vacuum in the chamber 108, and a "fine" pump that draws a final vacuum in the chamber 108 that essentially matches the vacuum within the downstream deposition head 62. Any suitable vacuum pump configuration may be utilized in this regard. The valves 110, 112 are configured as double seal gate valves in a particular embodiment.

When a vacuum pressure has been equalized between the vacuum lock chamber 108 and the downstream deposition head 62, the lower vacuum lock valve 112 opens and the lower dose cup 106 rotates to dump the source material, which is conveyed by gravity to a downstream transfer mechanism 132. After a short time delay, the lower dose cup 106 rotates to its upright position and the lower vacuum lock valve 112 closes. The vacuum lock chamber 108 is then vented and once the chamber is at atmospheric pressure, the upper vacuum lock valve 110 opens and the cycle repeats for another dose of the source material from the upper dose cup 104.

In the embodiment illustrated in FIG. 2 wherein vacuum lock valve 112 is utilized (with valves 110 and 112 being double seal gate valves), it is desirable to utilize vacuum pumping between the opposing two seals of the gate valves 110 and 112 to provide an additional reliability to enable continued operation in the event that incidental source material particles cause leaking by one or both of the gate valve seats. This is commonly referred to as "differential pumping."

The transfer mechanism 132 is disposed below the vacuum lock chamber 108 to receive the measured dose of source material from the lower dose cup 106. The transfer mechanism 132 is configured to transfer the source material to the downstream deposition head 62 without disrupting the vacuum or deposition process within the deposition head 62. A particular embodiment of the transfer mechanism 132 depicted in FIGS. 3 through 5 is a pneumatically actuated device that is supplied with actuating air via any suitably configured air system 162 (FIG. 2). The mechanism 132 includes a body 134 that defines an inlet 136 aligned for receipt of the measured dose of source material from the lower dose cup 106 through the downstream vacuum lock valve 112. The body 134 defines an outlet 138 that is aligned with fill port structure in the top wall of the deposition head 62. As discussed above, the source material is introduced into the deposition head 62 and distributed by distribution member 72 into the receptacle 66.

Referring again to FIGS. 3 through 5, the transfer mechanism 132 includes a first rotatable cylinder 140 and a second rotatable cylinder 142 configured within the body 134. The first rotatable cylinder 140 includes a scalloped recess 144 defined in a circumferential portion thereof. Likewise, the second rotatable cylinder 142 includes a scalloped recess 146 defined in a circumferential portion thereof. FIG. 3 illustrates an initial starting position of the respective cylinders 140, 142 wherein the recess 144 in the first cylinder 140 faces upward and receives the source material conveyed through the downstream valve 112. The recess 146 in the second cylinder 142 is at the nine o'clock position against the outer circumference of the first cylinder 140. The first cylinder 140 rotates clockwise within the recess 146 until the recess 144 in the first cylinder 140 is aligned opposite with the recess 146 in the second cylinder 142, as depicted in FIG. 4. Referring to FIG. 5, the first cylinder 140 is maintained in the position of FIG. 4 with its respective recess 144 at the three o'clock position as the second cylinder 142 is rotated counter-clockwise within the recess 144 until its respective recess 146 is at the six o'clock position. It should be readily appreciated that the second cylinder 142 rotates into the recess 144 of the first cylinder 140 as it rotates from the position illustrated in FIG. 4 to the position illustrated in FIG. 5. Thus, the source material is transferred from the first cylinder 140 to the second cylinder 146. When the recess 146 in the second cylinder 142 reaches the six o'clock position as illustrated in FIG. 5, the source material is conveyed by gravity to the outlet 138 in the body 134. The cylinders 140 and 142 then reset by reverse sequence to their respective starting positions illustrated in FIG. 3.

The relatively small clearances between the rotating cylinders 140, 142 and the body 134, as well as within the respective recesses 144, 146, ensure that, during operation, the moving surfaces of the transfer mechanism 132 are essentially self cleaning. It should also be appreciated that the sequential operation of the cylinders 140, 142 prevents any sublimated source material from the deposition head 62 from traveling upstream past the transfer mechanism 132, where any such gasses would plate-out over time and potentially clog or otherwise hinder operation of the feed system 100.

It should be appreciated that the sequencing of the transfer mechanism 132 is totally independent of the dosing sequence as performed by valve 112. Also, it should be noted that on a short term basis, the transfer mechanism 132 may operate with excess material stacked within and above inlet 136. This can be a normal operating state of the mechanism. However, to prevent long term accumulated stacking of material above the inlet 136, which could ultimately cause jamming of the feed system, the transfer mechanism 132 should, on the average, operate faster and with higher throughput than the upper dosing cup 104.

It may be desired to maintain the bottom portion of the transfer mechanism 132 at a relatively high temperature, for example greater than 600° C., to prevent any condensation and build up of source material from the deposition head 62 in, around, or below the outlet 138. For this purpose, a heater 170 may be configured around the bottom portion of the body 134.

It should be appreciated that, due to the high operating temperatures in which the transfer mechanism 132 must operate, refractory grade metals and other materials may be used in the construction of various components of the mechanism 132. These metals and materials may include, for example, molybdenum, tungsten, tungsten carbide, ceramic, graphite, stainless steel alloys, and the like.

In a relative sense, it may be desired to keep the upper portion of the transfer mechanism 132 at a cooler temperature so that the granular source material being conveyed therethrough does not sublimate prior to being introduced into the deposition head 62. Although not illustrated in the figures, for this purpose, it may be desired to supply external cooling to the upper portion of the transfer mechanism 132. This cooling may be, for example, a chilled-water line engaged around the upper portion of the body 134, forced air cooling, passive radiation cooling, or any other suitable type of cooling configuration.

It should be appreciated that operation of the cylinders 140, 142 may be by any suitable actuating mechanism. In a particular embodiment, rotation of the cylinders may be accomplished by crank arms and push rods that are powered by an external air system 162, which may include air cylinders associated with each respective cylinder 140, 142. In an alternate embodiment, the cylinders 140, 142 may be actuated in a single direction rotary fashion by one or more motor drives using coordinated and sequenced intermittent motion while still providing the necessary self-cleaning functions previously discussed. Another embodiment could utilize cylinders 140,142 having multiple scalloped recesses along with the intermittent motor drive. Yet a further embodiment could utilize single direction continuous rotary motion, whereby the external shapes of the two cylinders 140, 142 are appropriately designed to provide the small clearances needed for sublimated gas blocking and self-cleaning functions.

FIG. 8 illustrates an alternative embodiment of the feed system 100 that utilizes an additional downstream vacuum lock valve 154, which may be the same type of differential pumping gate valves discussed above with respect to the embodiment of FIG. 2. With this arrangement, the additional valve 154 would desirably include differential pumping between its opposing valve seats (seals). This configuration will allow the lowest downstream valve 154 to sufficiently maintain sealing of the vacuum in the downstream deposition head 62 while the upstream feed system components are removed for maintenance or other procedures.

The present invention also encompasses various process embodiments for continuously supplying source material to a vapor deposition apparatus without interrupting the vacuum deposition process wherein the source material is sublimated and deposited as a thin film on a substrate conveyed through the vapor deposition apparatus. It should be appreciated that the process embodiments may be carried out by any suitable configuration of feed system equipment or components. The process embodiments are not limited to the system embodiments discussed above.

In a particular embodiment, the process includes generating a measured amount of source material from a refillable supply hopper and moving the measured amount of source material into a vacuum lock chamber. Pressure within the chamber is then equalized with vacuum in a downstream deposition chamber. Once the vacuum pressures have equalized, the measured amount of source material is transferred into the downstream vacuum deposition chamber. In this way, vacuum pressure within the chamber is not interrupted by the process of resupplying the chamber with source material. Thus, the sublimation process within the deposition chamber may proceed continuously and is not interrupted for periodic resupply of source material. By means of continuous dosing of source material into the deposition chamber, the total material volume in residence within the deposition chamber can be kept relatively constant, thereby enabling the process conditions to be better controlled for production of more consistent films on the substrate.

In a unique embodiment, the process may include moving the source material into and out of the vacuum lock chamber by sequential operation of upstream and downstream vacuum lock valves.

The process may further include moving the measured amount of source material from the vacuum lock chamber and into a transfer mechanism, with the transferring mechanism being cyclically operated to transfer the source material into the downstream deposition chamber while blocking sublimated source material in the deposition chamber from moving upstream past the transfer mechanism.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A feed system for continuously feeding measured doses of source material to a vapor deposition apparatus, wherein the source material is sublimated and deposited as a thin film on a substrate, said system comprising:
   a bulk material hopper;
   an upper dose cup disposed to receive source material from said hopper;
   a lower dose cup disposed in a vacuum lock chamber to receive a measured dose of source material from said upper dose cup; and,
   a transfer mechanism disposed below said vacuum lock chamber to receive the measured dose of source material from said lower dose cup, said transfer mechanism configured to transfer the source material to a downstream deposition head while isolating the deposition conditions within the deposition head and blocking upstream diffusion of sublimated source to said feed system, wherein said transfer mechanism further comprises a body having an inlet and an outlet, and a first cylinder aligned with said inlet and a second cylinder aligned with said outlet, said first and second cylinders having scalloped recesses defined therein, and said first and second cylinders being sequentially rotatable such that source material from said inlet is received by said first cylinder recess and transferred to said second cylinder recess with rotation of said first cylinder, said second cylinder subsequently rotatable to deliver the source material in said second cylinder recess to said outlet, said recesses rotationally offset such that said cylinders block diffusion of sublimated source material between said outlet and inlet in all rotatable positions of said cylinders.

2. The feed system as in claim 1, wherein said vacuum lock chamber is defined between an upstream vacuum lock valve and a downstream vacuum lock valve.

3. The feed system as in claim 1, further comprising a transport mechanism disposed between said hopper and said upper dose cup, said transport mechanism operable to repeatedly deliver metered amounts of the source material to said upper dose cup.

4. The feed system as in claim 1, further comprising a ventilated enclosure surrounding said hopper and said upper dose cup, said enclosure further comprising a fill port through which source material is supplied to said hopper from an external source.

5. The feed system as in claim 1, further comprising a release mechanism configured with said upper dose cup, said release mechanism actuatable after said upper dose cup is filled with the measured amount of source material to pass the source material into said lower dose cup in said vacuum lock chamber.

6. The feed system as in claim 1, wherein said vacuum lock chamber is defined between sequentially operable vacuum lock valves, and further comprising a vacuum pump configured with said vacuum lock chamber.

7. A vapor deposition apparatus for vacuum deposition of a sublimated source material as a thin film on a substrate conveyed through said vapor deposition apparatus, comprising:
- a deposition head defining a deposition chamber in which source material supplied thereto is sublimated;
- a conveyor assembly operably disposed below said deposition head to convey a substrate through said apparatus while a thin film of the sublimated source material is deposited onto an upper surface of the substrate;
- a feed system configured with said deposition head to continuously feed measured doses of source material thereto, said feed system further comprising
- a bulk material hopper;
- an upper dose cup disposed to receive source material from said hopper;
- a lower dose cup disposed in a vacuum lock chamber to receive a measured dose of source material from said upper dose cup; and
- a transfer mechanism disposed below said vacuum lock chamber to receive the measured dose of source material from said lower dose cup, said transfer mechanism configured to transfer the source material to said downstream deposition head while isolating the deposition conditions within the deposition head and blocking upstream diffusion of sublimated source to said feed system, wherein said transfer mechanism further comprises a body having an inlet and an outlet, and a first cylinder aligned with said inlet and a second cylinder aligned with said outlet, said first and second cylinders having scalloped recesses defined therein, and said first and second cylinders being sequentially rotatable such that source material from said inlet is received by said first cylinder recess and transferred to said second cylinder recess with rotation of said first cylinder, said second cylinder subsequently rotatable to deliver the source material in said second cylinder recess to said outlet, said recesses rotationally offset such that said cylinders block diffusion of sublimated source material between said outlet and inlet in all rotatable positions of said cylinders.

8. The apparatus as in claim 7, wherein said vacuum lock chamber is defined between sequentially operational vacuum lock valves.

9. The apparatus as in claim 7, further comprising a transport mechanism disposed between said hopper and said upper dose cup, said transport mechanism operable to repeatedly deliver metered amounts of the source material to said upper dose cup, and further comprising an overflow catch configured at a transfer location of source material between said transport mechanism and said upper dose cup.

10. The apparatus as in claim 7, further comprising a ventilated enclosure surrounding said hopper and said upper dose cup, said enclosure further comprising a fill port through which source material is supplied to said hopper from an external source.

11. The apparatus as in claim 7, wherein said vacuum lock chamber is defined between sequentially operable vacuum lock valves, and further comprising a vacuum pump configured with said vacuum lock chamber.

* * * * *